United States Patent
Hsiao et al.

(10) Patent No.: US 9,217,917 B2
(45) Date of Patent: Dec. 22, 2015

(54) THREE-DIRECTION ALIGNMENT MARK

(71) Applicant: Taiwan Semiconductor Manufacturing Company, Ltd., Hsin-Chu (TW)

(72) Inventors: Ru-Shang Hsiao, Hsinchu County (TW); I-I Cheng, Tainan (TW); Jia-Ming Huang, Tainan (TW); Jen-Pan Wang, Tainan (TW); Ling-Sung Wang, Tainan (TW); Chih-Mu Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 14/192,225

(22) Filed: Feb. 27, 2014

(65) Prior Publication Data

US 2015/0241768 A1    Aug. 27, 2015

(51) Int. Cl.
    *H01L 21/76* (2006.01)
    *G03F 1/42* (2012.01)
    *H01L 23/544* (2006.01)
    *H01L 21/027* (2006.01)
    *G06T 7/00* (2006.01)

(52) U.S. Cl.
    CPC . *G03F 1/42* (2013.01); *G06T 7/001* (2013.01); *H01L 21/027* (2013.01); *H01L 23/544* (2013.01); *H01L 2223/54426* (2013.01)

(58) Field of Classification Search
    CPC ... H01L 21/426; H01L 21/467; H01L 21/475; H01L 21/2815; H01L 21/3081; H01L 21/3088; H01L 21/66; H01L 21/304; H01L 23/544; B32B 7/02; G03B 27/42; G03B 27/52; G03B 27/68
    USPC .......... 438/401, 400, 402, 241, 942; 257/678, 257/797, E21.006, E21.027, E21.058, 257/E21.119, E21.257, E21.258, E21.231, 257/E21.232, E21.233, E21.234
    See application file for complete search history.

(56) References Cited

U.S. PATENT DOCUMENTS

| | | | |
|---|---|---|---|
| 6,677,088 B2 * | 1/2004 | Magome et al. | 430/5 |
| 7,851,141 B2 * | 12/2010 | Wang | 430/394 |
| 8,130,361 B2 * | 3/2012 | Yasuda et al. | 355/53 |
| 8,203,692 B2 * | 6/2012 | Musa et al. | 355/52 |
| 8,609,441 B2 * | 12/2013 | Van Haren et al. | 438/5 |
| 8,722,179 B2 * | 5/2014 | Van Haren et al. | 428/213 |

* cited by examiner

*Primary Examiner* — David Nhu
(74) *Attorney, Agent, or Firm* — Haynes and Boone, LLP

(57) ABSTRACT

A semiconductor device includes a first material formed on a substrate. The first material includes a first alignment mark. The first alignment mark includes alignment lines in at least three directions. The semiconductor device further includes a second material comprising a second alignment mark. The second alignment mark corresponds to the first alignment mark such that when the second alignment mark is aligned with the first alignment mark, the second material is aligned with the first material.

20 Claims, 5 Drawing Sheets

THREE-DIRECTION ALIGNMENT MARK

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

One challenge to semiconductor fabrication is alignment. Semiconductor fabrication involves forming several patterned layers on top of each other. Each of these layers must be precisely aligned, or else the final device may not function correctly.

Alignment techniques often involve the use of alignment marks. For example, various layers to be patterned on a substrate may include alignment marks that are used to align with other formed layers. Matching alignment marks are formed within patterns of the subsequently formed layers. These matching alignment marks are placed within the patterns of the subsequent layers such that when aligned with the corresponding alignment marks of the underlying layers, both layers are aligned. But, such alignment techniques are not perfect because the subsequent patterns may be prone to stretching and twisting. Thus, it is desirable to have alignment techniques that provide improved alignment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
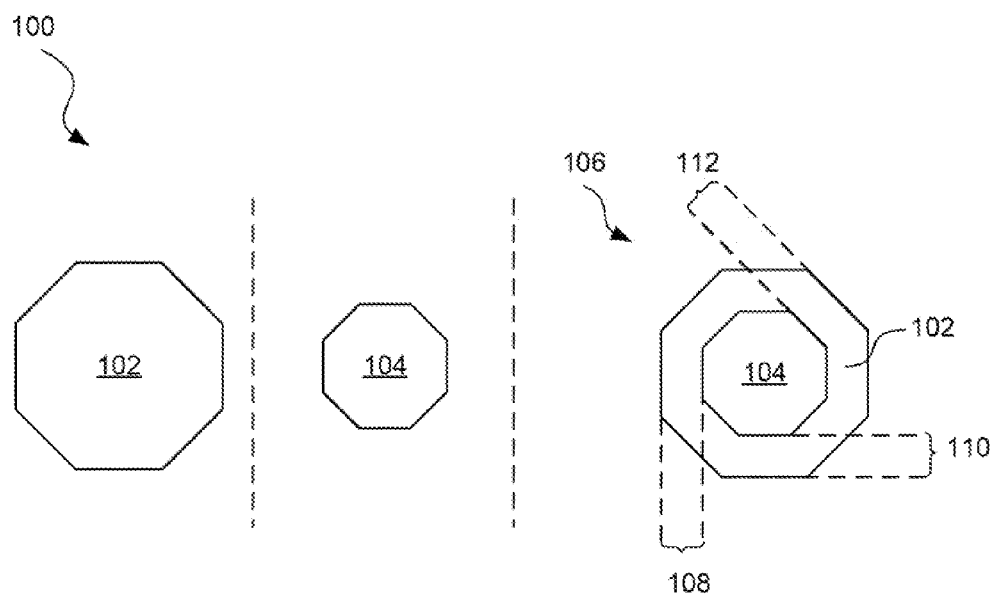
FIGS. 1A and 1B are diagrams showing illustrative three-direction alignment marks, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
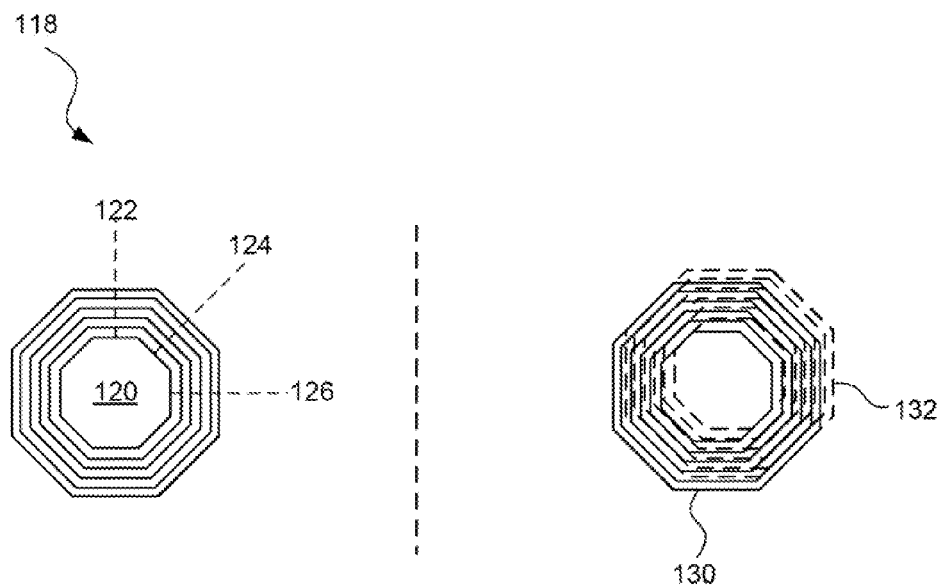

FIGS. 1A and 1B are diagrams showing illustrative three-direction alignment marks. FIG. 1A is a diagram showing an illustrative shape-in-shape type alignment mark 100 having an octagonal shape. As will be described in further detail below, an alignment mark embodying principles described herein may include different shaped marks having sides in at least three different directions.

A shape-in-shape type alignment mark 100 includes a first alignment mark 102 and a second alignment mark 104. The first alignment mark 102 is placed on a first layer, and the second alignment mark 104 is placed on a second type of material or second layer that is to be aligned with the first layer. Alternatively, the second alignment mark 104 is placed on the first layer and the first alignment mark 102 is placed on the second layer or second material to be aligned with the first layer.

As is illustrated, the first alignment mark 102 is larger than the second alignment mark 104. But, both alignment marks 102, 104 are identically shaped. The alignment marks 102, 104 are intended to be in alignment 106 when the smaller alignment mark 104 is within the exact center of the larger alignment mark 102. Based on the size difference between the two alignment marks 102, 104, there will be a specific distance 108, 110, 112 in each direction between the two marks 102, 104.

Specifically, the distance 108 between the edges of the alignment marks 102, 104 in the vertical direction will be a specific size when the two alignment marks 102, 104 are aligned. Additionally, the distance 110 between the edges of the alignment marks 102, 104 in the horizontal direction will be a specific size when the two alignment marks 102, 104 are aligned.

Because the alignment marks 102 104 are polygons with sides in at least three directions, a third direction can be checked. Specifically, the distance 112 between the edges of the alignment marks 102, 104 in the third, diagonal direction will be a specific size when the two alignment marks 102, 104 are aligned. By having this additional direction for checking the alignment, a better alignment between two layers may be realized.

FIG. 1B is a diagram showing an illustrative diffraction grating alignment mark 118 having a grating along at least three different directions. A diffraction grating alignment mark 118 uses principles of diffraction to determine whether two similar marks are aligned. Diffraction grating involves an optical component with a periodic structure. The periodic structure splits and diffracts light into several beams that then travel in different directions. The directions of these beams depend on the spacing of the grating and the wavelength of the light. By measuring the light, the nature of the periodic structure can be determined.

When using a diffraction grating alignment mark, an alignment mark 120 is placed formed on a first layer of material. Another alignment mark 120 is then formed on a second material, such as a photomask. Both alignment marks 120 are similar in size and shape. The alignment marks 120 may include a set of concentric polygonal shaped rings.

FIG. 1B illustrates an octagonal shape. Thus, there are at least three directions along which diffraction gratings can be measured. Specifically, the periodic structure along a first, vertical direction 122 may be measured. Additionally, the periodic structure along a second, horizontal direction 126 may be measured. Furthermore, the periodic structure along a third, diagonal direction 124 may be measured.

In one example, a first alignment mark 130 is formed on a first layer of material. The second alignment mark 132, which for illustrative purposes is presented with dotted lines, may be formed on a second material such as a photomask. If the alignment marks 130, 132 are appropriately placed within their respective patterns, and if the two alignment marks 130, 132 are aligned, then the photomask will be appropriately aligned to the first layer of material.

It can be determined whether the two alignment marks 130, 132 are aligned by measuring the diffraction of light off of the gratings in the multiple direction 122, 124, 126. The diffracted light from two alignment marks that are not in alignment will be different than the diffracted light from two alignment marks that are in alignment. Thus, if the diffracted light measured along a specific direction 122, 124, 126 is similar to that of a single mark, then it is known that the two overlaying alignment marks 130, 132 are in alignment.

Figure 2:
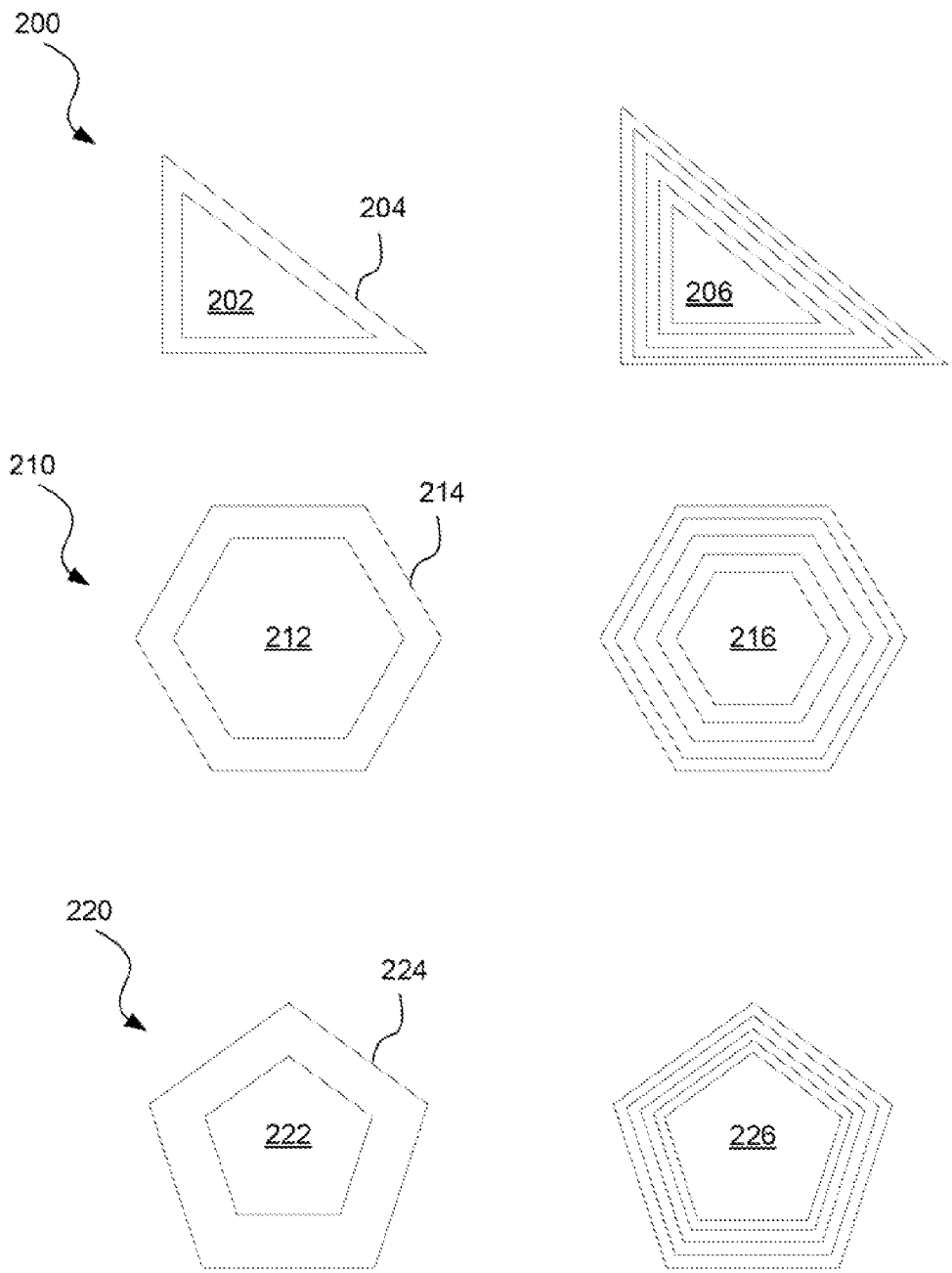
FIG. 2 is a diagram showing illustrative polygonal alignment marks having sides in at least three different directions, in accordance with some embodiments.

FIG. 2 is a diagram showing illustrative polygonal alignment marks having sides in at least three different directions. According to certain illustrative examples, an alignment mark embodying principles described herein may be of a variety of non-rectangular shapes. Rectangular shapes have sides in only two directions. But, various non-rectangular shapes have sides in at least three directions.

In one example, the alignment mark may be triangular shaped 200. In one example, the triangular shaped alignment mark may be a shape-in-shape alignment mark. In other words, a first alignment mark 204 may be a larger triangle shape and a corresponding second alignment mark 202 may be a smaller triangle shape that fits within the first triangular shaped alignment mark 204. The distance between edges on all three sides of the alignment marks 202, 204 may be used to determine whether the triangular shaped alignment marks 202, 204 are aligned.

In some examples, triangular shaped alignment marks may be diffraction grating alignment marks 206. In such examples, the alignment marks 206 may include a set of concentric triangles. Each of the three sides creates a different diffraction pattern that can be used to align one alignment mark 206 to another corresponding alignment mark 206.

In one example, the alignment mark may be hexagonal shaped 210. In one example, the hexagonal shaped alignment mark may be a shape-in-shape alignment mark. In other words, a first alignment mark 214 may be a larger hexagonal shape and a corresponding second alignment mark 212 may be a smaller hexagonal shape that fits within the first hexagonal shaped alignment mark 204. The distance between edges on at least three sides of the alignment marks 212, 214 may be used to determine whether the hexagonal shaped alignment marks 212, 214 are aligned.

In some examples, hexagonal shaped alignment marks may be diffraction grating alignment marks 216. In such examples, the alignment marks 216 may include a set of concentric hexagons. Each of the six sides creates a different diffraction pattern that can be used to align one alignment mark 216 to another corresponding alignment mark 216.

In one example, the alignment mark may be pentagonal shaped 220. In one example, the pentagonal shaped alignment mark may be a shape-in-shape alignment mark. In other words, a first alignment mark 224 may be a larger pentagonal shape and a corresponding second alignment mark 222 may be a smaller pentagonal shape that fits within the first pentagonal shaped alignment mark 224. The distance between edges on at least three sides of the alignment marks 222, 224 may be used to determine whether the hexagonal shaped alignment marks 222, 224 are aligned.

In some examples, pentagonal shaped alignment marks may be diffraction grating alignment marks 226. In such examples, the alignment marks 226 may include a set of concentric pentagons. Each of the five sides creates a different diffraction pattern that can be used to align one alignment mark 226 to another corresponding alignment mark 226.

Figure 3A:
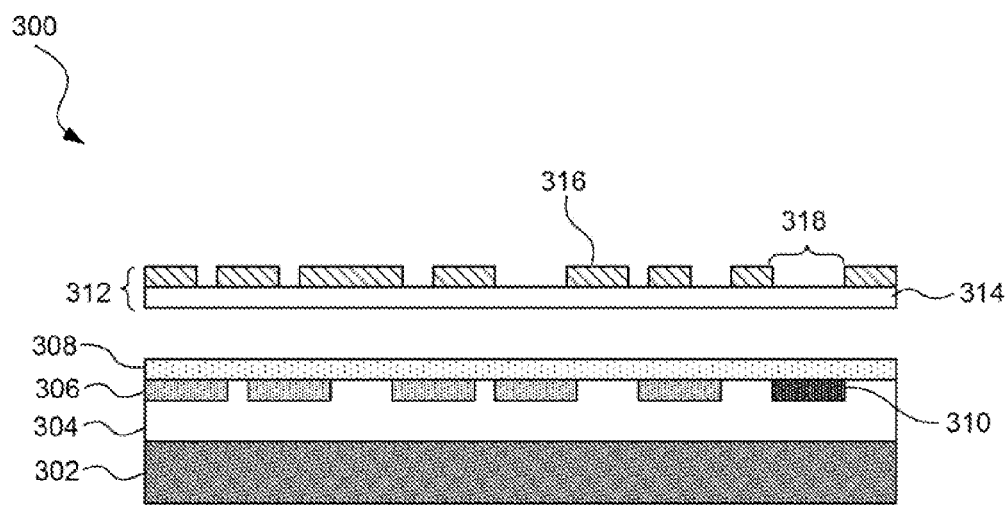
FIGS. 3A and 3B are diagrams showing an illustrative process for aligning different layers, in accordance with some embodiments.
Figure 3B:
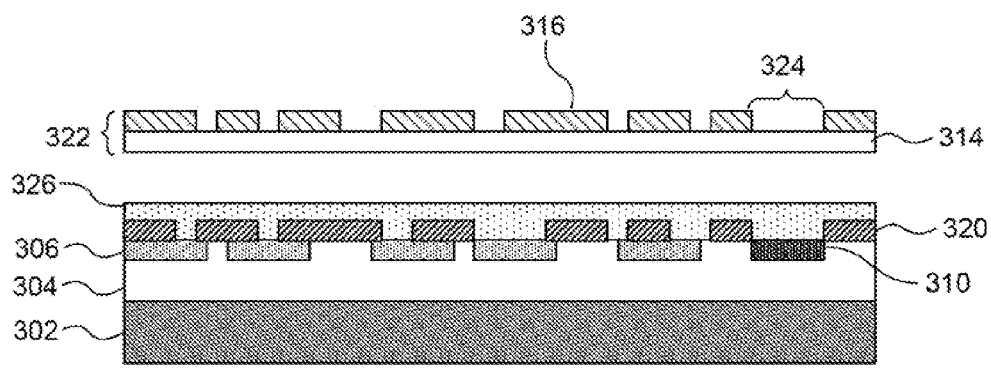

FIGS. 3A and 3B are diagrams showing an illustrative process for aligning different layers using a mask set. According to the present example, a first material 304 is formed onto a substrate 302. The first material 304 has a first pattern 306 formed thereon. The first pattern 306 may be for a variety of different types of processes. For example, the first pattern 306 may be for an etching process to create a series of trenches that are to be filled with a metal material. In some examples, the pattern may be for forming a series of features such as gate structures.

Semiconductor fabrication typically involves forming several layers on top of each other. Thus, alignment marks 310, 318, 324 are used to align one layer to another. In one example, a first alignment mark 310 is formed with the features of the first pattern 306. The alignment mark 310 within the first pattern 306 does not necessarily contribute to the circuitry like the other features within the pattern.

A photoresist layer 308 may then be deposited over the first pattern 306. The photoresist layer 308 is a transparent material that changes its chemical structure based on exposure to a light source. The difference in chemical structures between exposed regions and unexposed regions allows for selective removal of the photoresist layer 308 with a developer solution.

The first photomask 312 includes a transparent solid material 314 such as glass. On top of the solid material is a light blocking material 316 such as chromium. The light blocking material 316 is patterned to expose the desired portions of the photoresist layer 308 to a light source such as an ultraviolet light source. The pattern of the light blocking material 316 also includes an alignment mark 318 corresponding to the alignment mark 310 of the first material layer 304.

The two alignment marks 310, 318 may correspond in different ways depending on the type of alignment mark. For example, if a shape-in-shape type alignment mark is used, then the bottom alignment mark 310 may be a smaller polygonal shape, such as octagonal, and the upper alignment mark 318 may be a larger polygonal shape. It can thus be determined when the photomask is properly aligned when the two alignment marks are properly aligned.

In one example, if the alignment marks are diffraction grating alignment marks, then both alignment marks 310, 318 will be similar. For example, if the bottom alignment mark 310 is a set of concentric hexagonal rings, then the top alignment mark 318 within the photomask will be a similar set of concentric hexagonal rings. The sets of hexagonal rings will diffract light in a specific manner when properly aligned. Thus, it can be determined if the photomask is properly aligned with the underlying pattern 306.

The photomask 312 may stretch and twist in a variety of directions. Additionally, the photoresist layer 308 may not be entirely smooth. These issues can interfere with proper alignment. But, by having a third direction that can be measured for alignment allows for a better alignment process. Better alignment leads to better yield for the manufacturer.

FIG. 3B is a diagram showing an illustrative example of an alignment mark 324 within a second photomask 322. According to the present example, the alignment mark 310 of the first pattern is formed as described above. A patterned second material 320 is in place. The patterned second material 320 corresponds to the pattern of the first photomask 312.

Another photoresist layer 326 is then placed on top of the second material layer 320. In this example, the pattern of the second material layer is such that the alignment mark 310 of the first layer 304 is still exposed. In some examples, however, the second material layer 320 may cover the alignment mark 310 but be transparent enough so that the alignment mark 310 can be seen clearly enough through both the second material layer 320 and the photoresist layer 326 in order to align the alignment mark 324 of the photomask 322. After the photoresist layer 326 is exposed and developed, the photoresist layer 326 will then have an alignment mark formed therein.

Figure 4:
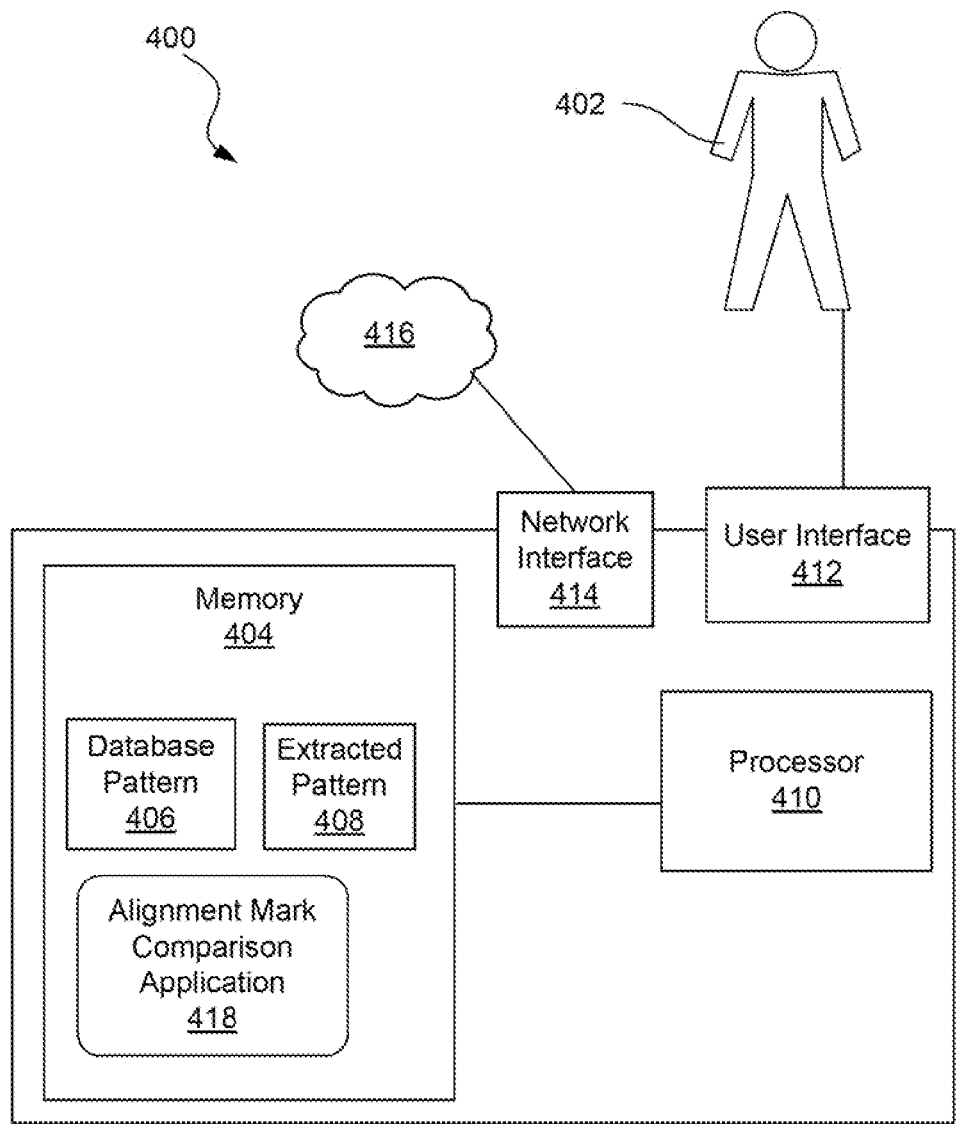
FIG. 4 is a diagram showing an illustrative computing system that can be used for comparison of alignment marks, in accordance with some embodiments.

FIG. 4 is a diagram showing an illustrative computing system that can be used for comparison of alignment marks. According to certain illustrative examples, the computing system 400 includes a memory 404 which may store machine readable instructions such as software. Additionally, the memory may store other types of data. The computing system 400 also includes a processor 410, a network interface 414, and a user interface 412.

The memory 404 may include several different types of memory. Some types of memory are non-volatile and thus store data regardless of whether power is being supplied to the memory. An example of a non-volatile memory is a solid state drive. Non-volatile types of memory typically have large storage volume but relatively slow performance. Other types of memory, such as those used for Random Access Memory (RAM), are optimized for speed and are often referred to as "working memory." The various types of memory may store various types of information as needed for different functions.

The computing system 400 also includes a processor 410 for executing the software and using or updating data stored in memory 404. The software may include an operating system and various other software applications. For example, the software may include an alignment mark comparison application 418.

The alignment mark comparison application 418 may be designed to compare an extracted pattern 408 with a database pattern. For example, a pattern may be formed onto a substrate. The pattern may include an alignment mark as described herein, particularly, an alignment mark having at least three measurable directions. An imaging tool may then be used to take an image of the pattern formed on the substrate. The alignment mark comparison application 418 may then extract the pattern as printed and create an extracted pattern 408.

The extracted pattern 408 represents the designed pattern as it was formed. Thus, any defects or irregularities within the formed pattern will be present within the extracted pattern 408. The extracted pattern 408 can then be compared with the database pattern 406. The database pattern 406 represents the pattern as it should have been formed. In other words, the database pattern 406 represents the ideal pattern. The database pattern 406 is thus a virtual pattern.

The database pattern 406 includes an alignment mark that corresponds with the alignment mark printed on the pattern. Thus, the extracted pattern 408 can be virtually compared with the database pattern 406. To do this comparison, the extracted patter 408 and the database pattern 406 should be virtually aligned. The alignment marks within the extracted pattern 408 and the database pattern 406 allow such alignment. A user 402 can then determine the degree of error within the printed pattern based on the comparison.

The user interface 412 may include a number of input devices such as a mouse, touchpad, or touchscreen that allow the user 402 to interact with a GUI. The user interface 412 may also include a number of different types of output devices such as a monitor or a touchscreen. The user interface allows the user 402 to interact with the computing system 400.

The network interface 414 may include hardware and software that allows the processing system 400 to communicate with other processing systems over a network 416. The network interface 414 may be designed to communicate with the network 416 through hardwire media such as Ethernet, coaxial, fiber-optic, etc. The network interface 416 may also be designed to communicate with the network 416 using wireless technologies.

Figure 5:
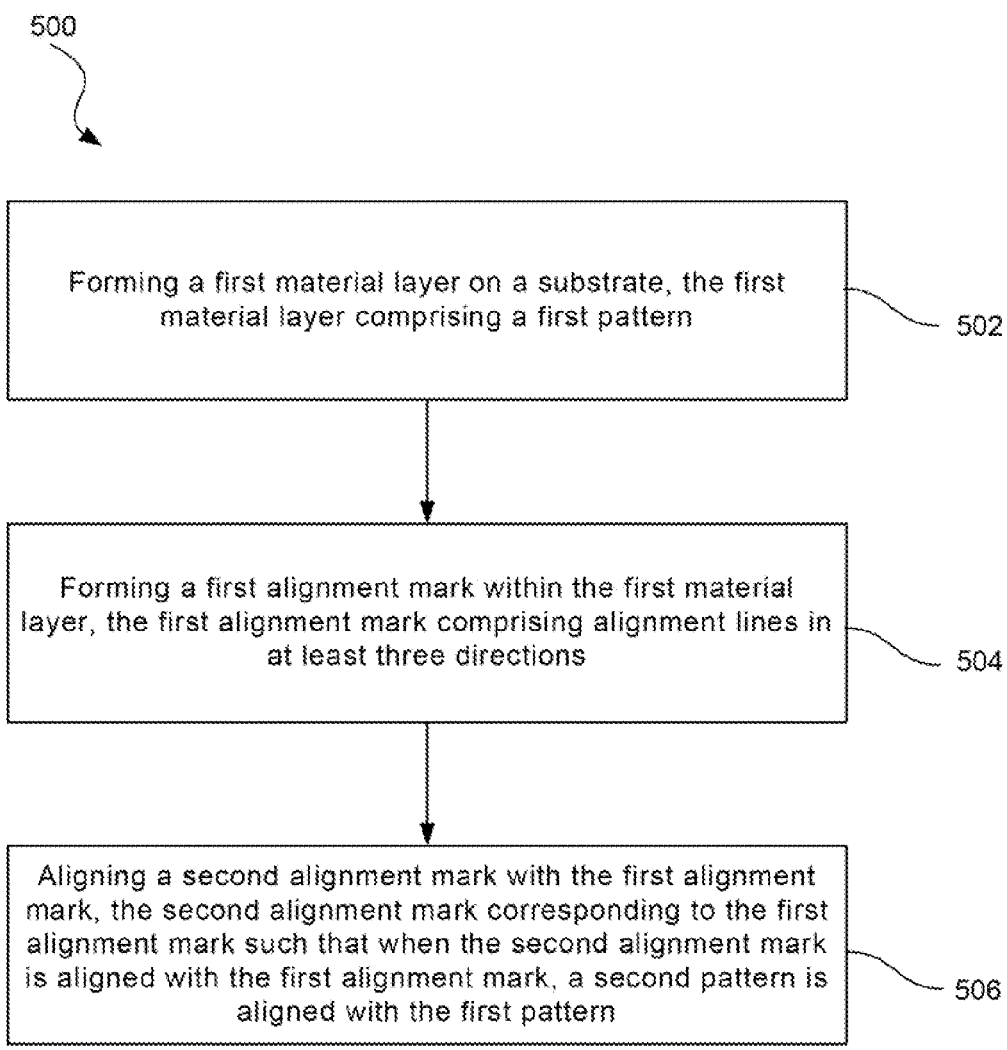
FIG. 5 is a flowchart showing an illustrative method for alignment using alignment marks with sides in at least three directions, in accordance with some embodiments.

FIG. 5 is a flowchart showing an illustrative method for alignment using alignment marks with sides in at least three directions. According to the present example, the method 500 includes a step 502 for forming a first material layer on a substrate, the first material layer comprising a first pattern. The first material may be made of a variety of materials typically used in semiconductor fabrication.

The method 500 further includes a step 504 for forming a first alignment mark within the first material layer, the first alignment mark comprising alignment lines in at least three directions. For example, the alignment mark may be a non-rectangular polygon such as a triangle, pentagon, hexagon, or octagon. The alignment mark may also be a shape-in-shape type alignment mark or a diffraction grating alignment mark.

The method further includes a step for aligning a second alignment mark with the first alignment mark, the second alignment mark corresponding to the first alignment mark such that when the second alignment mark is aligned with the first alignment mark, a second pattern is aligned with the first pattern. The second alignment mark and second pattern may be part of a photomask. Alternatively, the second alignment mark and second pattern may be part of a photoresist layer after exposure by a photomask having the alignment mark.

According to some embodiments, a semiconductor device comprises a first material layer formed on a substrate, the first material layer comprising a first alignment mark, the first alignment mark comprising alignment lines in at least three directions. The semiconductor device further comprises a second material layer comprising a second alignment mark, the second alignment mark corresponding to the first alignment mark such that when the second alignment mark is aligned with the first alignment mark, the second material layer is aligned with the first material layer.

According to some embodiments, a mask set includes a first photomask, comprising a first pattern, the first pattern comprising a first alignment mark, the first alignment mark having alignment lines in at least three directions. The mask set further includes a second photomask comprising a second pattern, the second pattern comprising a second alignment mark, the second alignment mark corresponding to the first alignment mark. The first alignment mark and the second alignment mark are positioned respectively within the first photomask and the second photomask such that when the second alignment mark is aligned with the first alignment mark, the first pattern is aligned with the second pattern.

According to certain illustrative examples, a method for alignment includes forming a first material layer on a substrate, the first material layer comprising a first pattern, forming a first alignment mark within the first material layer, the first alignment mark comprising alignment lines in at least three directions, and aligning a second alignment mark with the first alignment mark, the second alignment mark corresponding to the first alignment mark such that when the second alignment mark is aligned with the first alignment mark, a second pattern is aligned with the first pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first material layer formed on a substrate, the first material layer comprising a first alignment mark having a polygonal shape, the first alignment mark comprising alignment lines in at least three different directions; and
   a second material layer comprising a second alignment mark having a polygonal shape, the second alignment mark corresponding to the first alignment mark such that when the second alignment mark is aligned with the first alignment mark, the second material layer is aligned with the first material layer.

2. The semiconductor device of claim 1, wherein the second alignment mark matches a shape of the first alignment mark.

3. The semiconductor device of claim 2, wherein the second alignment mark is larger than the first alignment mark.

4. The semiconductor device of claim 1, wherein the first alignment mark and the second alignment mark comprise diffraction grating alignment marks.

5. The semiconductor device of claim 1, wherein the first alignment mark and the second alignment mark comprise triangular shaped alignment marks.

6. The semiconductor device of claim 1, wherein the first alignment mark and the second alignment mark comprise hexagonal shaped alignment marks.

7. The semiconductor device of claim 1, wherein the first alignment mark and the second alignment mark comprise octagonal shaped alignment marks.

8. A mask set comprising:
   a first photomask, comprising a first pattern, the first pattern comprising a first alignment mark having a polygonal shape, the first alignment mark having alignment lines in at least three directions;
   a second photomask comprising a second pattern, the second pattern comprising a second alignment mark having a polygonal shape, the second alignment mark corresponding to the first alignment mark;
   wherein, the first alignment mark and the second alignment mark are positioned respectively within the first photomask and the second photomask such that when the second alignment mark is aligned with the first alignment mark, the first pattern is aligned with the second pattern.

9. The mask set of claim 8, wherein a shape of the first alignment mark matches a shape of the second alignment mark.

10. The mask set of claim 9, wherein the second alignment mark is a different size than the first alignment mark.

11. The mask set of claim 8, wherein both the first alignment mark and the second alignment mark comprise similarly sized concentric rings that create a diffraction grating in at least three directions.

12. The mask set of claim 8, wherein the first alignment mark and the second alignment mark comprise octagonal shaped alignment marks.

13. The mask set of claim 8, wherein the first alignment mark and the second alignment mark comprise hexagonal shaped alignment marks.

14. The mask set of claim 8, wherein the first alignment mark and the second alignment mark comprise pentagonal shaped alignment marks.

15. A method for alignment marks comprising:
   forming a first material layer on a substrate, the first material layer comprising a first pattern;
   forming a first alignment mark within the first material layer, the first alignment mark comprising alignment lines in at least three directions, the first alignment mark having a polygonal shape;
   aligning a second alignment mark with the first alignment mark, the second alignment mark having a polygonal shape, the second alignment mark corresponding to the first alignment mark such that when the second alignment mark is aligned with the first alignment mark, a second pattern is aligned with the first pattern.

16. The method of claim 15, wherein the second pattern is formed on a photomask and aligning the first alignment mark with the second alignment mark comprises aligning the photomask to the first material layer.

17. The method of claim 16, wherein:
   the second pattern is part of formed within a second material layer formed on the first material layer, the second pattern being formed within the second material layer; and
   aligning the first alignment mark with the second alignment mark comprises patterning the second material layer such that the second alignment mark is aligned with the first alignment mark.

18. The method of claim 17, wherein aligning the first alignment mark with the second alignment mark comprises comparing the first alignment mark with the second alignment mark in each of the at least three directions.

19. The method of claim 18, wherein the second alignment mark and the second pattern comprise a virtual pattern, the method further comprising:
   with a computing system, extracting the first pattern formed on the first material layer; and
   with the computing system, looking for defects formed within the first pattern based on a comparison of the second pattern with the first pattern.

20. The semiconductor device of claim 1, wherein the first alignment mark and the second alignment mark comprise pentagonal shaped alignment marks.

* * * * *